(12) United States Patent
Carter et al.

(10) Patent No.: US 8,154,305 B2
(45) Date of Patent: Apr. 10, 2012

(54) SYSTEMS, METHODS, AND APPARATUS FOR CONNECTION FAULT SELF-MONITORING WITH DC BIAS CURRENT

(75) Inventors: Roy Anthony Carter, Salem, VA (US); William Duggan Brackman, Jr., Salem, VA (US); John Robert Booth, Salem, VA (US)

(73) Assignee: General Electric Company, Schenectady, NY (US)

( * ) Notice: Subject to any disclaimer, the term of this patent is extended or adjusted under 35 U.S.C. 154(b) by 10 days.

(21) Appl. No.: 12/837,605

(22) Filed: Jul. 16, 2010

(65) Prior Publication Data

US 2012/0013345 A1 Jan. 19, 2012

(51) Int. Cl.
*G01R 31/04* (2006.01)
*G01R 31/02* (2006.01)
*G01R 31/08* (2006.01)

(52) U.S. Cl. ............ 324/538; 324/541; 324/522

(58) Field of Classification Search ............ 324/541, 324/544, 538, 522
See application file for complete search history.

(56) References Cited

U.S. PATENT DOCUMENTS

| | | | |
|---|---|---|---|
| 4,291,204 A * | 9/1981 | Crick | 324/456 |
| 4,414,539 A | 11/1983 | Armer | |
| 7,288,933 B2 | 10/2007 | Covington et al. | |
| 7,564,249 B2 * | 7/2009 | Bauer et al. | 324/713 |

* cited by examiner

*Primary Examiner* — Amy He
(74) *Attorney, Agent, or Firm* — Sutherland Asbill & Brennan LLP

(57) ABSTRACT

Certain embodiments of the invention may include systems, methods, and apparatus for providing connection fault self-monitoring with DC bias current. According to an example embodiment of the invention, a method is provided for obtaining measurements and detecting connectivity faults associated with a voltage mode sensor. The method can include coupling a DC bias current into a circuit. The circuit includes a voltage mode sensor, and the voltage mode sensor can output a time varying signal. The method can also include setting a nominal level of the DC bias current, monitoring a voltage associated with the DC bias current, and determining circuit connectivity status based at least in part on monitoring the voltage.

20 Claims, 4 Drawing Sheets

SYSTEMS, METHODS, AND APPARATUS FOR CONNECTION FAULT SELF-MONITORING WITH DC BIAS CURRENT

FIELD OF THE INVENTION

This invention generally relates to connection fault monitoring, and in particular, to connection fault self-monitoring with a DC current.

BACKGROUND OF THE INVENTION

Sensor systems often require multiple connectors and long cable runs to transmit signals from the sensor elements to receivers and processors located remotely. When a connector fails or when a cable develops an open conductor condition, erroneous signals may go un-noticed and may lead to unsafe conditions, for example, or the machinery being monitored may operate incorrectly until operators notice the problem and repair the connection. In certain sensors, particularly in linear variable differential transformer (LVDT)-based sensors, remotely generated excitation signals can be provided to sensor elements by shielded twisted pair excitation cables, for example. The amplitude of the excitation signal coupling through the LVDT sensor as a function of the sensor position, for example, may then be transmitted back to the remote receiver via a separate return shielded twisted pair. Certain open-circuit connection scenarios exist where excitation signals may couple from the excitation source to the receiver via shielding or ground paths without transduction from the actual sensor. In such scenarios, the received excitation signal can appear to be a valid signal, and may be extremely difficult to diagnose and correct.

BRIEF SUMMARY OF THE INVENTION

Some or all of the above needs may be addressed by certain embodiments of the invention. Certain embodiments of the invention may include systems, methods, and apparatus for connection fault self-monitoring with DC bias current.

According to an example embodiment of the invention, a method is provided for obtaining measurements and detecting connectivity faults associated with a voltage mode sensor. The method can include coupling a DC bias current into a circuit. The circuit can include a voltage mode sensor, and the voltage mode sensor can output a time varying signal. The method can also include setting a nominal level of the DC bias current, monitoring a voltage associated with the DC bias current, and determining circuit connectivity status based at least in part on monitoring the voltage.

According to another example embodiment, a system is provided for obtaining measurements and detecting connectivity faults. The system includes a voltage mode sensor for producing a time varying signal, a differential amplifier, at least one transmission cable operable to transmit signals between the voltage mode sensor and the differential amplifier, and at least one source operable for providing a DC bias current to a circuit including the voltage mode sensor and the at least one transmission cable. The system also includes at least one processor in communication with the differential amplifier and configured for determining connectivity of the circuit based at least in part on monitoring a voltage associated with the bias current.

According to another example embodiment, an apparatus is provided for obtaining measurements and detecting connectivity faults. The apparatus includes a differential amplifier in communication with a voltage mode sensor, at least one source operable for providing a DC bias current to the voltage mode sensor, and one or more resistors for coupling the DC bias current to the voltage mode sensor from the at least one source.

Other embodiments and aspects of the invention are described in detail herein and are considered a part of the claimed invention. Other embodiments and aspects can be understood with reference to the following detailed description, accompanying drawings, and claims.

BRIEF DESCRIPTION OF THE FIGURES

Reference will now be made to the accompanying tables and drawings, which are not necessarily drawn to scale, and wherein.

DETAILED DESCRIPTION OF THE INVENTION

Figure 1:
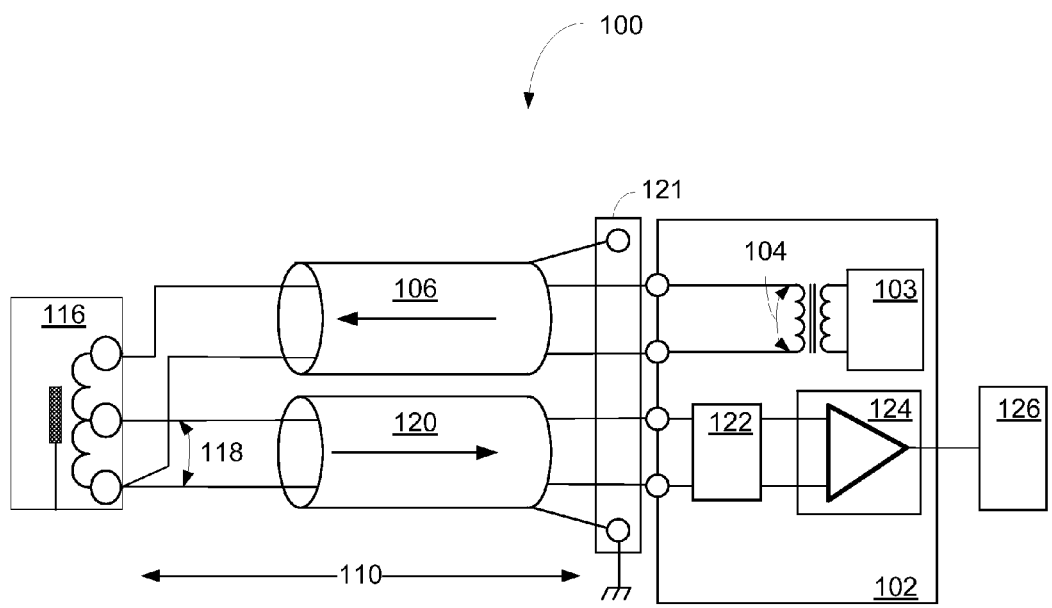
FIG. 1 is a block diagram of an illustrative position sensing system according to an example embodiment of the invention.

Embodiments of the invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Certain embodiments of the invention may enable self-monitoring of circuit connectivity issues associated with a sensor system. According to certain example embodiments, a small bias current may be injected into the circuit path of a voltage mode sensor such that the bias current flows through all of the series connections, cables and sensor. Due to a small resistance of the voltage mode sensor, the bias current may produce a small voltage drop across the sensor when the sensor and cables are electrically connected, but the small voltage drop may not be enough to degrade the sensor signal source. According to example embodiments of the invention, the voltage drop across the sensor, cables, and/or connectors may increase to a higher value in an open circuit condition. According to an example embodiment, the voltage drop may be monitored at the receiver to determine connectivity of the system. According to an example embodiment, system monitoring may detect the out-of-range input value and cause an alarm or status signal to be asserted indicating the invalid input condition. This signal may be acted upon to mitigate impact of the condition and/or stored for later access during system diagnostics.

According to example embodiments of the invention, a sensor system may be provided to measure one or more physical phenomena, such as position, pressure, temperature, acceleration, levels, currents, voltages, etc. In an example embodiment, the signals may be considered valid as long as they stay within their expected operating range. An open connection fault, for example, may cause the signal receiver to produce an invalid voltage signal within a certain range, and may cause improper, self-destructive or even unsafe system behavior. According to example embodiments, an alarm or health status signal can be triggered in an out-of-range event to avoid detrimental reactions and provide diagnostic guidance for repair. In such an example system with redundant sensor inputs, the knowledge that a particular signal source is corrupt may allow the system to isolate the corrupt signal source until it is repaired, and to react normally with the remaining valid input(s), thereby, increasing the system availability.

In certain example embodiments of the invention, the normal operating range of the sensor and detector circuitry may be set to compensate for a small bias voltage produced by the bias current, and may allow detection of both open and shorted input wiring on both the sensor outputs and its excitation to wiring, connections, cables, and other connectivity components.

Various components and circuits for providing the bias current and monitoring the connectivity will now be described with reference to the accompanying figures, according to example embodiments of the invention.

FIG. 1 illustrates a block diagram of an example position sensing system 100, according to an example embodiment of the invention. In certain example embodiments, the system 100 can include an excitation source and feedback detector block 102, which may include an excitation source 103 for producing an excitation signal 104, a bias current circuit 122 for producing a biasing current, and a differential amplifier 124 for receiving a voltage mode signal from a sensor 116. In certain example embodiments of the invention, the sensor 116 may be a voltage mode sensor, such as a linear variable differential transformer (LVDT). In certain example embodiments of the invention, the excitation signal 104 may be transmitted to the sensor 116 via an excitation cable 106. In certain example embodiments of the invention, the excitation cable 106, the sensor 116, and a return cable 120 may provide a path for a direct current signal (produced by the bias current circuit 122) for monitoring the connectivity of the sensor and associated cables and connections. The excitation cable 106, for example, may include twisted pair conductors for transmitting the excitation signal 104 and bias current to the sensor 116. In certain example embodiments of the invention, a feedback signal 118 produced (or variably through-coupled) by the sensor may travel back to the differential amplifier 124 via a return cable 120. In certain example embodiments, the feedback signal 118 may include a direct current (DC) voltage component resulting from a voltage drop across the sensor 116, as well as an alternating current (AC) voltage component associated with a scaled version of the excitation signal 104. In example embodiments of the invention, the return cable 120 may include twisted pair conductors for transmitting the feedback signal 118 to the differential amplifier 124. In an example embodiment, the signal produced by the differential amplifier may be transmitted to a processor 126 for further analysis, recording, or controlling of other parameters.

According to example embodiments of the invention, the excitation cable 106 and/or the return cable 120 may include shielding that may be tied to a grounded shield bar, for example. In certain embodiments of the invention, the cable length 110 of the excitation cable 106 and the return cable 120 can be of an appreciable length (10-100 meters, for example) such that the capacitance of the twisted pair to ground may provide an unintended path for a portion of the excitation signal 104 to show up on the input of the differential amplifier 124 under circuit open circuit scenarios, as will now be discussed with reference to FIG. 2.

Figure 2:
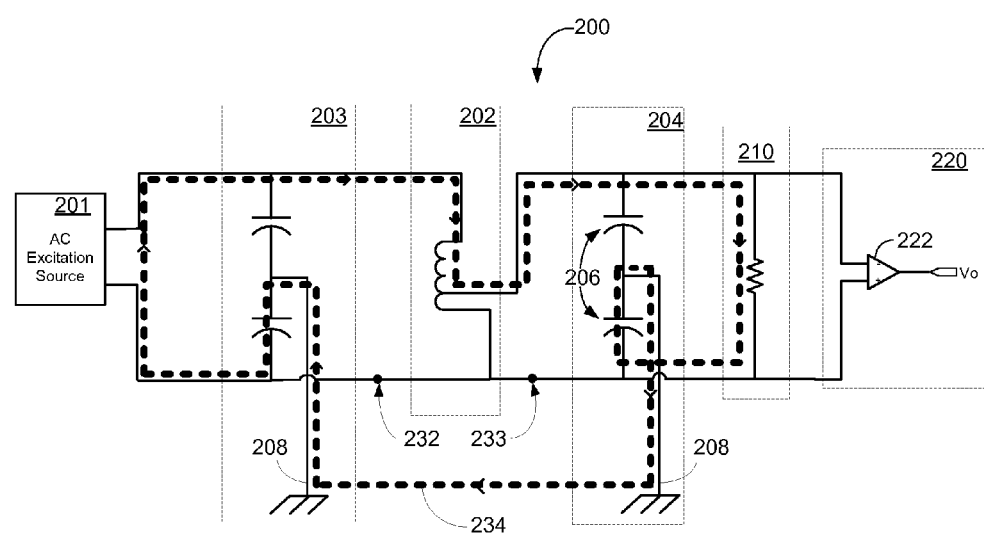
FIG. 2 is a circuit diagram of a conventional LVDT circuit with an excitation signal path completed through ground or shielding.

FIG. 2 shows a conventional circuit diagram of an LVDT position sensor system 200 to highlight an issue that can happen when an excitation signal couples through ground and shielding (via cable capacitance) to the input of a receiver. The system 200 depicts a version of a sensing system with the AC excitation source 201 on the far left, and the receiver block 220 on the far right. In this scenario, a shielded excitation cable 203 may supply an excitation signal from the AC excitation source 201 to a winding in an LVDT sensor 202. In certain systems, the LVDT sensor 202 may be configured to allow a small percentage of the excitation signal to pass directly through the LVDT sensor 202, through a shielded signal return cable 204, and to a sensing or loading resistor 210 for measurement by the operational amplifier 222. The system 200 also depicts cable capacitance 206 to ground 208 (or to the shielding). This cable capacitance 206 may be proportional to the length of the cable (203, 204), and may become appreciably large when the cable (203, 204) is long. For example, a 500-foot (152.4 meter) cable may have about a 0.03 microfarad capacitance to ground, which may present a path for current to flow to ground (or to the shielding). A 0.03 microfarad cable capacitance to ground may present about a 1500 ohm path to ground for a 3.2 KHz excitation signal, for example. In an example scenario, where a cable or connector has malfunctioned and created an open circuit at a first open circuit location 232 or a second open circuit location 233, the signal path 234 through ground (or shielding) may complete the circuit, and an unintended portion of the excitation signal 104 may appear across the loading resistor 210 at the input of the differential amplifier 222 and produce a false signal.

Figure 3:
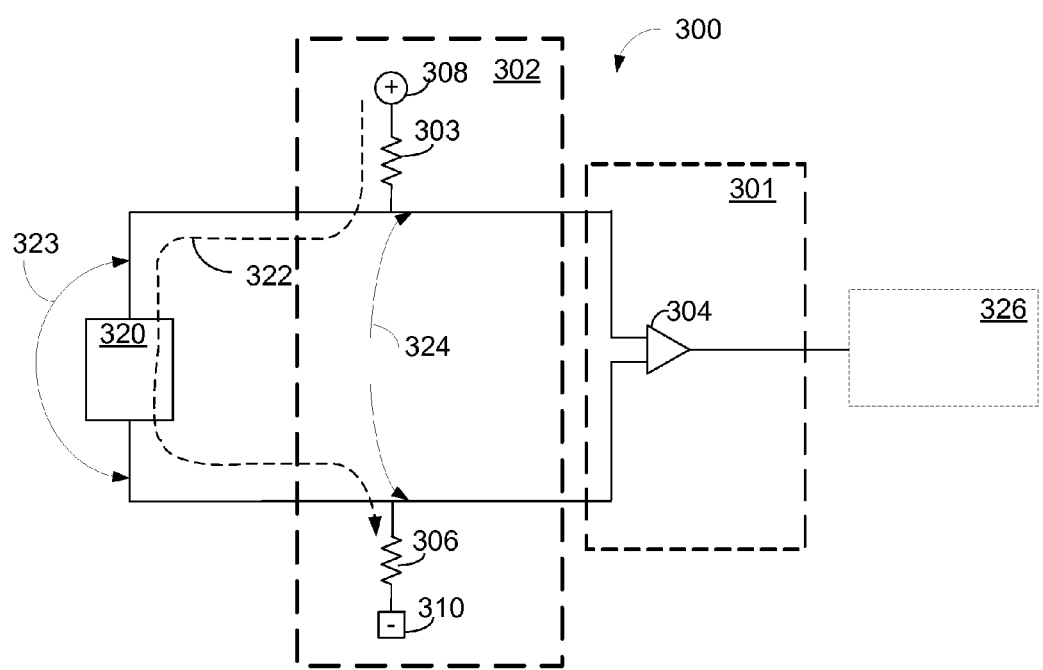
FIG. 3 is a block diagram of an illustrative self-monitoring circuit with DC bias current according to an example embodiment of the invention.

FIG. 3 depicts a self-monitoring circuit 300 in accordance with example embodiments of the invention. Example embodiments of the circuit 300 may facilitate detection of open circuit conditions in cabling, connectors, and other components associated with voltage mode sensors. In an example embodiment, the circuit 300 may include a sensing block 301 including a differential amplifier 304, a current biasing block 302 (which is a modification of block 210 from FIG. 2) including resistors (303, 306) and voltage supplies (308, 310), and a cabling and sensor block 320. In certain embodiments of the invention, a positive voltage supply 308 may supply bias current 322 through a high side bias resistor 303. The bias current may flow through the cabling and sensor 320, and through a low side bias resistor 306 to a negative voltage supply 310. According to example embodiments of the invention, the sensor within the cabling and sensor block 320 may include a small series resistance that may cause a small DC voltage drop of bias voltage 324 across the sensor. The bias voltage 324 and any time varying signal 323 produced or transferred by the sensor may then be detected by the operational amplifier 304.

According to an example embodiment of the invention, the normal operating bias voltage 324 may be set by controlling values such as the sensor series resistance, the bias resistors (303, 306), and/or the supply voltages (308, 310). In certain example embodiments of the invention, when any part of the bias current 322 path is open circuited, the approximate voltage difference between the positive voltage supply 308 and the negative voltage supply 310 may be present on the input of the differential amplifier 304, and may be detected and interpreted as an open circuit by the processor 326.

Figure 4:
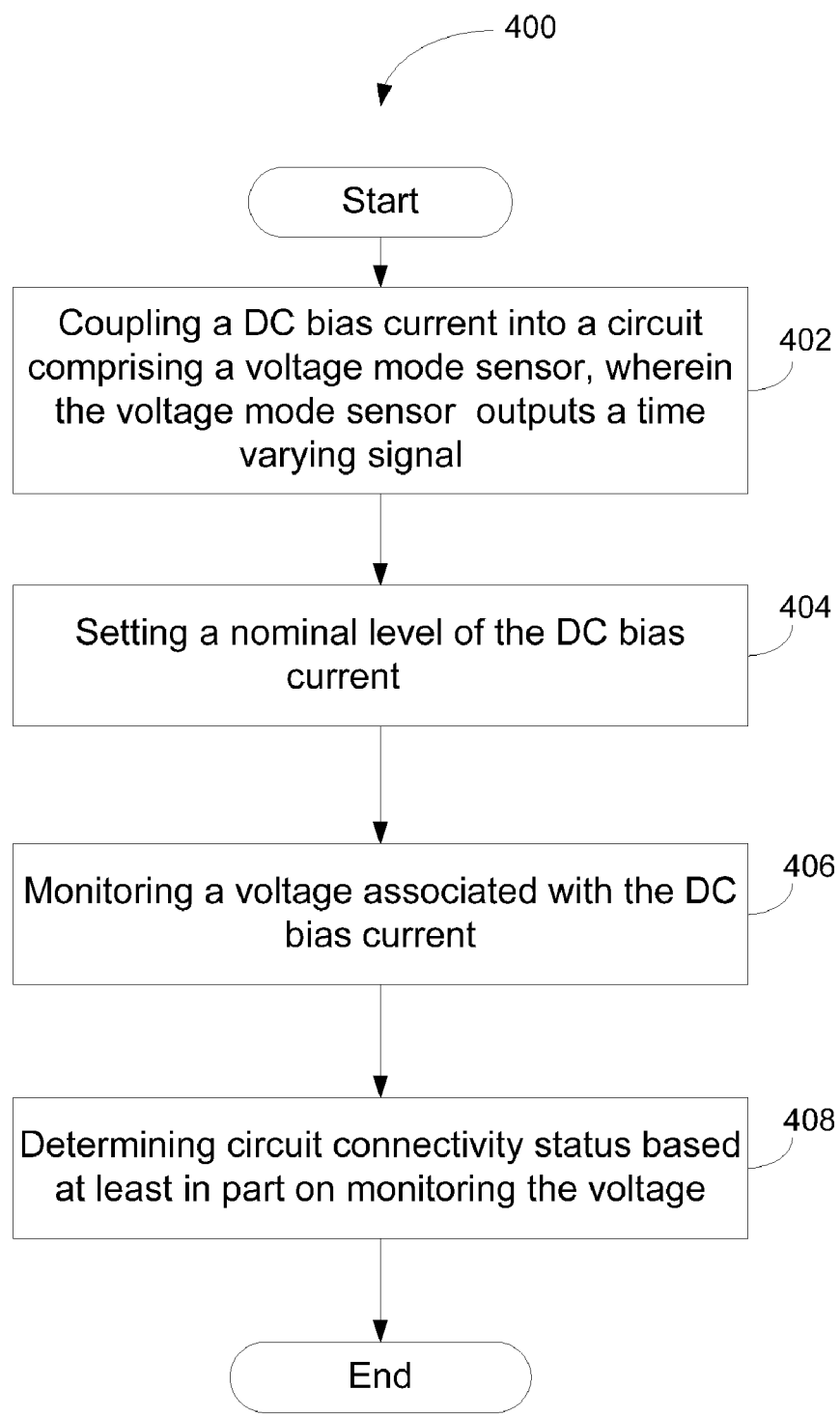
FIG. 4 is a flow diagram of an example method according to an example embodiment of the invention.

An example method 400 for obtaining measurements and detecting connectivity faults associated with a voltage mode sensor will now be described with reference to the flowchart of FIG. 4 in accordance with an embodiment of the invention. The method 400 starts in block 402 and includes coupling a DC bias current into a circuit including a voltage mode sensor, wherein the voltage mode sensor outputs a time varying signal. In block 404, the method 400 includes setting a nominal level of the DC bias current. In block 406, and according to an example embodiment, the method 400 includes monitoring a voltage associated with the DC bias current. In block 408, the method 400 includes determining circuit connectivity status based at least on the monitoring the voltage.

In accordance with certain example embodiments of the invention, additional method elements may be implemented. For example, in one embodiment, the method may include providing an excitation signal 104 to the voltage mode sensor 116, and monitoring a feedback signal 118 from the voltage mode sensor 116. In an example embodiment, the feedback signal 118 may include at least a coupled portion of the excitation signal 104 when the circuit 300 is closed. In certain example embodiments, the method may also include determining circuit connectivity status based at least in part on comparing a rectified average of the feedback signal 118 to a voltage limit. In an example embodiment, the method may include monitoring a time varying signal 323 from the voltage mode sensor 116 and determining circuit connectivity status based at least in part on monitoring the time varying signal 323. In an example embodiment of the invention, the method may include coupling a DC bias current 322 into local ports in communication with a remote time varying voltage mode sensor 116, and setting a nominal level of the DC bias current by limiting the DC bias current 322 with one or more current limiters 303, 306. In an example embodiment, coupling the DC bias current 322 into the circuit 300 may include coupling the DC bias current from the at least one source 308, 310. In certain example embodiments of the invention, the current limiters 303, 306 may be resistors. In certain example embodiments the method, coupling the DC bias current 322 into the circuit may include coupling DC bias current 322 into one or more signal cables.

Certain example embodiments of the system 100 may include a self-monitoring circuit 300 operable to detect open circuit conditions in a bias current 322 path. In example embodiments, the system 100 may include an excitation signal generator 103 operable for providing an excitation signal 104 to a voltage mode sensor 116. In certain example embodiments, at least one processor 126 is configured for monitoring a feedback signal 118 from the voltage mode sensor 116, wherein the feedback signal 118 includes at least a coupled portion of the excitation signal 104 when the circuit 300 is closed.

Certain example embodiments of the system 100 may include at least one rectifier or rectifier circuit for transforming an alternating current feedback signal 118 associated with the voltage mode sensor 116 to a direct current signal, wherein the direct current signal may be representative of sensor output and/or circuit 300 connectivity. In certain example embodiments of the system 100, at least one processor 126 may be further operable for monitoring a time varying signal 323 from the voltage mode sensor 116 and determining circuit connectivity status based at least in part on monitoring the time varying signal 323. In certain example embodiments, the system 100 may include a self monitoring circuit 300, where the self monitoring circuit 300 may include at least one source 308, 310 operable for coupling the DC bias current 322 into the circuit 300. In an example embodiment, coupling the DC bias current 322 can include coupling DC current into local ports in communication with a remote voltage mode sensor and cabling 320.

Accordingly, example embodiments of the invention can provide the technical effects of creating certain systems, methods, and apparatus that provide self-monitoring of a connectivity status of a sensor circuit. Example embodiments of the invention can provide the further technical effects of providing systems, methods, and apparatus for producing a measurable change in a voltage associated with a sensor circuit upon a connectivity change of the sensor, connectors, or connecting cables.

In example embodiments of the invention, the position sensing system 100 and the self-monitoring circuit 300 may include any number of hardware and/or software applications that are executed to facilitate any of the operations.

In example embodiments, one or more I/O interfaces may facilitate communication between the position sensing system 100 and the self-monitoring circuit 300, and one or more input/output devices. For example, a universal serial bus port, a serial port, a disk drive, a CD-ROM drive, and/or one or more user interface devices, such as a display, keyboard, keypad, mouse, control panel, touch screen display, microphone, etc., may facilitate user interaction with the position sensing system 100 and the self monitoring circuit 300. The one or more I/O interfaces may be utilized to receive or collect data and/or user instructions from a wide variety of input devices. Received data may be processed by one or more computer processors as desired in various embodiments of the invention and/or stored in one or more memory devices.

One or more network interfaces may facilitate connection of the position sensing system 100 and the self monitoring circuit 300 inputs and outputs to one or more suitable networks and/or connections; for example, the connections that facilitate communication with any number of sensors associated with the system. The one or more network interfaces may further facilitate connection to one or more suitable networks; for example, a local area network, a wide area network, the Internet, a cellular network, a radio frequency network, a Bluetooth™ (Owned by Telefonaktiebolaget LM Ericsson) enabled network, a Wi-Fi™ (owned by Wi-Fi Alliance) enabled network, a satellite-based network any wired network, any wireless network, etc., for communication with external devices and/or systems.

As desired, embodiments of the invention may include the position sensing system 100 and the self-monitoring circuit 300 with more or less of the components illustrated in FIGS. 1 and 3.

The invention is described above with reference to block and flow diagrams of systems, methods, apparatuses, and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

While the invention has been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose the invention, including the best mode, and to enable any person skilled in the art to practice the invention, including making and using any devices or systems and performing any incorporated methods. The patentable scope of the invention is defined in the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A method for obtaining measurements and detecting connectivity faults associated with a voltage mode sensor, comprising:
    coupling a DC bias current into a circuit comprising a voltage mode sensor, wherein the voltage mode sensor outputs a time varying signal;
    setting a nominal level of the DC bias current;
    monitoring a voltage associated with the DC bias current; and
    determining circuit connectivity status based at least in part on monitoring the voltage.

2. The method of claim 1, further comprising providing an excitation signal to the voltage mode sensor, and monitoring a feedback signal from the voltage mode sensor, wherein the feedback signal comprises at least a coupled portion of the excitation signal when the circuit is closed.

3. The method of claim 2, further comprising determining circuit connectivity status based at least in part on comparing a rectified average of the feedback signal to a voltage limit.

4. The method of claim 1, further comprising monitoring a time varying signal from the voltage mode sensor and determining circuit connectivity status based at least in part on monitoring the time varying signal.

5. The method of claim 1, wherein coupling the bias current comprises coupling current into local ports in communication with a remote time varying voltage mode sensor.

6. The method of claim 1, wherein setting the nominal level of the DC bias current comprises limiting the DC bias current with one or more current limiters.

7. The method of claim 1, wherein coupling the DC bias current into the circuit further comprises coupling DC bias current into one or more signal cables.

8. A system for obtaining measurements and detecting connectivity faults, comprising:
    a voltage mode sensor for producing a time varying signal;
    a differential amplifier;
    at least one transmission cable operable to transmit signals between the voltage mode sensor and the differential amplifier;
    at least one source operable for providing a DC bias current to a circuit comprising the voltage mode sensor and the at least one transmission cable; and,
    at least one processor in communication with the differential amplifier and configured for determining connectivity of the circuit based at least in part on monitoring a voltage associated with the bias current.

9. The system of claim 8, further comprising one or more resistors for coupling the DC bias current into the circuit from the at least one source.

10. The system of claim 8, further comprising an excitation signal generator operable for providing an excitation signal to the voltage mode sensor, wherein the at least one processor is configured for monitoring a feedback signal from the voltage mode sensor, wherein the feedback signal comprises at least a coupled portion of the excitation signal when the circuit is closed.

11. The system of claim 8, further comprising a rectifier for transforming an alternating current feedback signal associated with the voltage mode sensor to a direct current signal, wherein the direct current signal is representative of sensor output and circuit connectivity.

12. The system of claim 8, wherein the at least one processor is further operable for monitoring a time varying signal from the voltage mode sensor and determining circuit connectivity status based at least in part on monitoring the time varying signal.

13. The system of claim 8, wherein the at least one source is operable for coupling the DC bias current into the circuit, wherein coupling the DC bias current comprises coupling DC current into local ports in communication with a remote voltage mode sensor.

14. An apparatus for obtaining measurements and detecting connectivity faults, comprising:
    a differential amplifier in communication with a voltage mode sensor;
    at least one source operable for providing a DC bias current to the voltage mode sensor; and,
    one or more resistors for coupling the DC bias current to the voltage mode sensor from the at least one source, wherein connectivity of faults is determined based at least in part on monitoring a voltage associated with the bias current.

15. The apparatus of claim 14, further comprising at least one processor in communication with the differential amplifier and configured for determining connectivity of the voltage mode sensor based at least in part on monitoring a voltage associated with the DC bias current.

16. The apparatus of claim 15, further comprising an excitation signal generator operable for providing an excitation signal to the voltage mode sensor, wherein the at least one processor is configured for monitoring a feedback signal from the voltage mode sensor, wherein the feedback signal comprises at least a coupled portion of the excitation signal.

17. The apparatus of claim 15, wherein the at least one processor is further operable for monitoring a time varying signal from the voltage mode sensor and determining circuit connectivity status based at least in part on monitoring the time varying signal.

18. The apparatus of claim 15, wherein the at least one processor is further configured for outputting an alert or status signal when the monitored voltage associated with the DC bias current meets or exceeds a predetermined limit.

19. The apparatus of claim 14, wherein the at least one source is operable for coupling the DC bias current to the voltage mode sensor, wherein coupling the DC bias current comprises coupling current into local ports in communication with a remote voltage mode sensor.

20. The apparatus of claim 14, further comprising a rectifier for transforming an alternating current signal associated with the voltage mode sensor to a direct current signal.

* * * * *